Figure 1A:
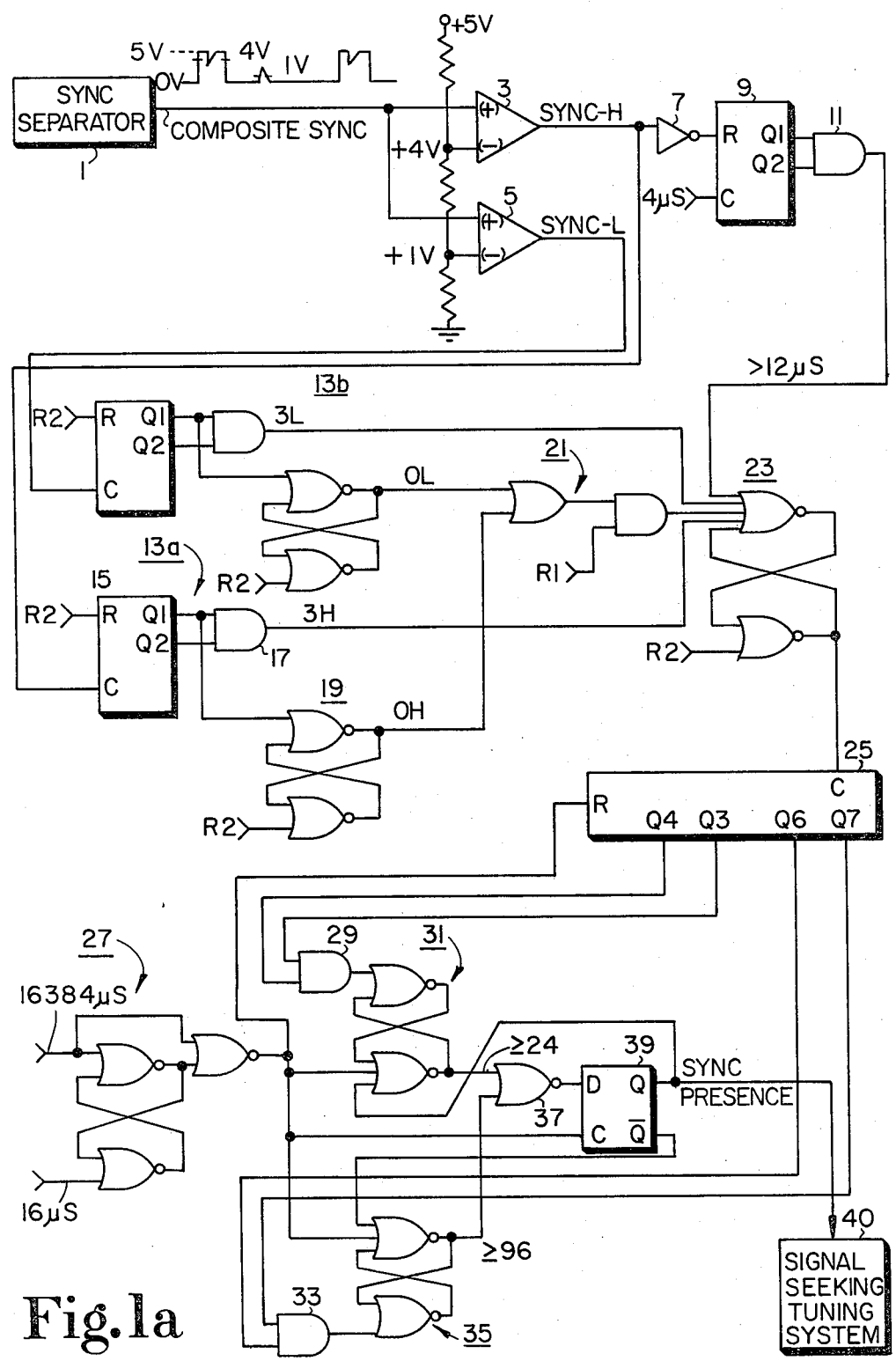

United States Patent [19]

French et al.

[11] 4,364,094

[45] Dec. 14, 1982

[54] DIGITAL ARRANGEMENT FOR DETECTING A CORRECT TELEVISION SYNCHRONIZATION SIGNAL OUTPUT USEFUL IN A SIGNAL SEEKING TUNING SYSTEM

[75] Inventors: Michael P. French; Juri Tults, both of Indianapolis, Ind.

[73] Assignee: RCA Corporation, New York, N.Y.

[21] Appl. No.: 261,449

[22] Filed: May 8, 1981

[51] Int. Cl.³ .......................... H04N 5/50; H04N 7/02
[52] U.S. Cl. ................................... 358/193.1; 358/139
[58] Field of Search .............. 358/193.1, 192.1, 191.1, 358/195.1, 148, 139, 158, 153; 307/360

[56] References Cited

U.S. PATENT DOCUMENTS 4,205,347 5/1980 Minoura et al. ................. 358/193.1

Primary Examiner—John C. Martin
Attorney, Agent, or Firm—E. M. Whitacre; P. J. Rasmussen; P. M. Emanuel

[57] ABSTRACT

A detector for determining the validity of a composite synchronization signal to indicate the presence of a picture carrier includes two threshold comparators set just below and just above the maximum and minimum amplitude excursions, respectively, of the synchronization pulses. The output pulses of the threshold comparators are counted during a reference interval to determine if the frequency of the synchronization pulses is correct. Due to the threshold comparators, noise transients are detected and counted so as to cause an incorrect frequency indication. In addition, reference pulses are counted during the duration of the output pulses generated by one of the threshold comparators to determine if the width of the synchronization pulses is correct. The number of incorrect counts of the frequency or width is counted during a measurement interval. If the number of incorrect counts exceeds a predetermined limit, the composite synchronization signal is not a valid one. Hysteresis is also provided to prevent sporadic transitions of sync presence indication.

5 Claims, 2 Drawing Figures

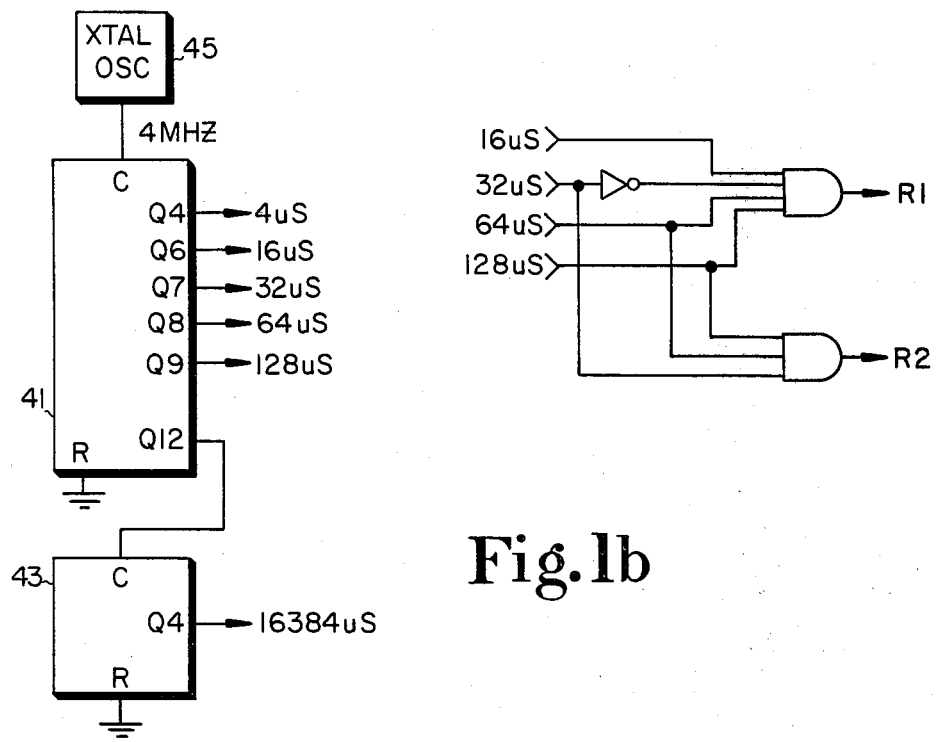
Fig.1b
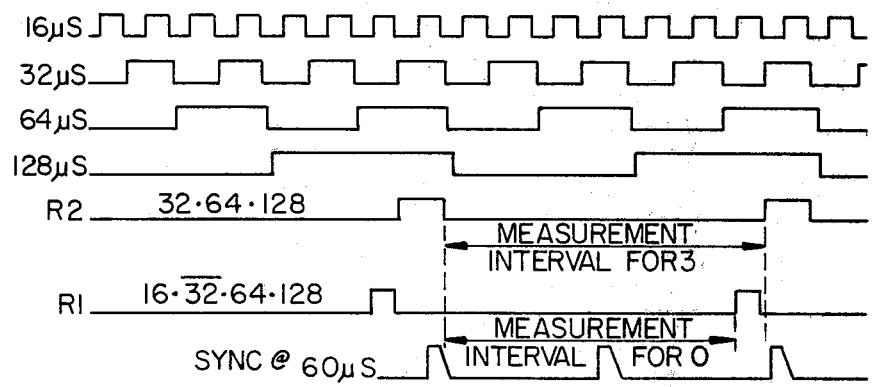
Fig.2
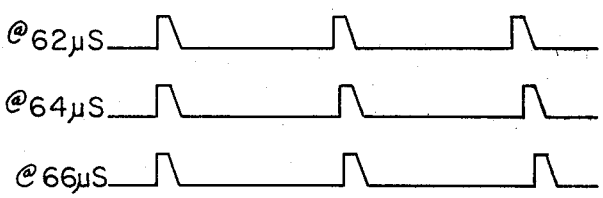

DIGITAL ARRANGEMENT FOR DETECTING A CORRECT TELEVISION SYNCHRONIZATION SIGNAL OUTPUT USEFUL IN A SIGNAL SEEKING TUNING SYSTEM

The present invention concerns an arrangement for detecting a correct television synchronization signal output in a signal seeking tuning system. A variety of signal seeking tuning systems for television receivers are known. Typically these employ detectors for examining both an automatic fine tuning (AFT) voltage, which represents the frequency deviation of the IF picture carrier from its nominal value, and picture synchronization pulses.

A variety of detectors are known in the art for examining synchronization pulses to determine the presence of a picture carrier. However, typically they only examine one parameter of the synchronization signal and therefore cannot detect when the synchronization component is in error due to other parameters.

The present preferred embodiment of the synchronization component detector for determining the presence of a picture carrier includes portions for determining the presence of noise components, the frequency of the synchronization pulses, and the width of the synchronization pulses. An error counter is employed to count the number of errors occurring in these parameters during a measurement interval. If the error count is within predetermined limits, an indication of the presence of the picture carrier is generated.

The preferred embodiment of the present invention will be described with reference to the accompanying Drawing in which:

FIGS. 1a and 1b show the logic diagram of the preferred embodiment of the present invention; and FIG. 2 is a graphical representation of signal waveforms useful in facilitating an understanding of the embodiment of FIGS. 1a and 1b.

In the following description, concurrent reference to FIGS. 1a, 1b and 2 will be helpful.

In FIG. 1, a composite synchronization (sync) signal is generated in conventional fashion by a sync separator 1 of a television receiver. Assuming the composite sync signal to have nominal NTSC parameters, the synchronization pulses have a width of 4 microseconds and a period of 63.5 microseconds. The present sync presence detector examines the pulse width, period and noise content of the composite sync signal to determine if it is correct. p To that end, the composite signal, e.g., having excursions between +5 volts and ground potential, is coupled to the non-inverting (+) inputs of threshold comparators 3 and 5. A relatively high reference voltage, e.g., +4 volts, just below the maximum pulse amplitude, is applied to the inverting (−) input of comparator 3. A relatively low reference voltage, just above the minimum pulse amplitude, e.g., +1 volt, is applied to the inverting (−) input of comparator 5. Absent noise transients in the composite sync signal, each of the output signals of comparator 3 and 5 will include a number of pulses equal to the number of pulses in the composite synchronization signal. However, if undesired negative-going noise transients are present, these will result in extra pulses in the output signal of comparator 3. Similarly, if positive-going noise transients are present, there will be extra pulses in the output signal of comparator 5.

The output signal of comparator 3, hereinafter called SYNC-H, is coupled through an inverter 7 to the reset (R) input of a binary ripple counter 9 comprising, e.g., a CD4024 integrated circuit (IC) available from RCA Corporation, Somerville, New Jersey. A reference signal with a 4 microsecond period is applied to the clock (C) input of binary counter 9. The Q1 and Q2 output signals are applied to an AND gate 11. In essence, this allows the number of 4 microsecond clock pulses to be roughly measured during the SYNC-H pulse width. (It is noted that since the 4 microsecond clock pulses are not synchronized with the SYNC-H pulses, this width measurement is only an approximate one. However, it has been found to be effective to detect most, if not all, width errors.) If the pulses have a pulse width less than 8 microseconds, since the clock signal is only 4 microseconds long, the pulse width is taken as being correct and a count of 3 will not be reached. Accordingly, the output of AND gate 11 will be at a low logic level ("0"). However, if the SYNC-H pulses have a width greater than 8 microseconds, a count of 3 will be reached and the output of AND gate 11 will be a high logic level ("1").

The SYNC-H signal is also applied to a period counter 13a. Specifically, this SYNC-H signal is applied to the clock (C) input of a binary ripple counter 15, which may also comprise a CD4024 IC, along with a reference signal R2 as a reset signal to the reset (R) input. If the frequency of the SYNC-H signal is excessive, e.g., due to the presence of noise transients, counter 15 will reach a count of 3 and AND gate 17 will produce a "1". A set-reset flip-flop 19 is set in response to R2. If the frequency of the SYNC-H signal is low, counter 15 will not reach a count of "1" and SR FF 19 will remain a "1". The output signal of flip-flop 19 is gated at the rate of a reference sampling signal R1 through a gating circuit 21 to a set (S) input of SR FF 23. The output of AND gate 17 is also applied to an S input of SR FF 23. The output signal of AND gate 11 is also applied to an S input of SR FF 23. Another frequency counter 13b, similar to 13a and having its output also coupled to an S input of SR FF 23, is responsive to the SYNC-L signal produced at the output of comparator 5 and therefore determines when its frequency is incorrect.

If any S input of SR FF 23 is a "1" before a reference signal R2, which is applied to the reset (R) inputs of SR FFs 19 and 23, occurs, a clock pulse is applied to a clock (C) input of an error counter, comprising a binary ripple counter 25, such as a CD4040 IC, when R2 is a "1".

The number accumulated by error counter 25 during a 16,384 microsecond measurement interval established by a timing circuit 27 determines whether the composite synchronization signal is correct or not. In response to the Q4 and Q5 output signals of binary counter 25, a first AND gate 29 sets a first SR FF 31 when the number of errors is 24 or more. In response to the Q6 and Q7 output signals, a second AND gate 33 sets a second SR FF 35 when the number of errors is 96 or more. The output signals of FFs 31 and 35 are applied through a NOR gate 37 to the D input of a D FF 39. When a positive edge of the output signal of timing circuit 27 is generated, if either one of the input signals of NOR gate 37 is a "1", the Q output signal of FF 39, i.e., the "sync presence" signal, is set to a "0", indicating an incorrect sync signal. Conversely, if neither one of the input signals of NOR gate 37 is a "1", the Q output signal of FF 39 is set to a "1", indicating a correct composite synchronization signal.

The Q and $\overline{Q}$ output signals of FF 39 are fed back to the reset inputs of FFs 31 and 35 to prevent the output signals of FF 39 from changing state from one timing interval to the next when the error count is between 24 and 96. This provides hysteresis to prevent sporadic transitions in the output signals of FF 39. The sync presence signal is coupled to a signal seeking tuning system 40 to indicate the presence of a picture carrier. A signal seeking tuning systme which advantageously employs the present sync presence detector is described in U.S. Pat. application Ser. No. 261,450, entitled "Dual Search Mode Type Tuning System", concurrently filed in the names of the same inventors and assigned to the same assignee.

FIG. 1b shows a logic arrangement for generating the various timing signals referred to above. It includes two cascade binary ripple counters 41 and 43 comprising, e.g., CD4040 and CD4024 ICs, respectively. A 4 MHz signal generated by a crystal oscillator 45 provides the clock (C) signals for counter 41. The remaining portion of the timing circuit includes an inverter and two AND gates combining the output signals of counter 41 to generating timing signals R1 and R2. The timing diagrams for the logic of FIG. 1b is shown in FIG. 2. Also shown in FIG. 2 is the relationship between composite sync pulses of various frequencies and the measurement intervals between R2 pulses and between R2 and R1.

While the present sync presence detector has been described in terms of timing signals suitable for determining the accuracy of a composite sync signal which when correct conforms to NTSC standard, the timing signals may be modified for other standards. This and other modifications are intended to be within the scope of the present invention as defined by the following claims.

What is claimed is:

1. A detector for determining the correctness of a television synchronization signal including synchronization pulses for use in a signal seeking tuning system, comprising:
   first threshold comparator means for generating first output pulses when said synchronization signal has an amplitude component below a first predetermined threshold below the maximum excursion of said synchronization pulses;
   second threshold comparator means for generating second output pulses when said synchronization signal has an amplitude component above a second predetermined threshold above the minimum excursion of said synchronization pulses;
   first counter means for counting the number of said first output pulses during a measurement interval;
   second counter means for counting the number of said second output pulses during said measurement interval;
   first count comparator means for determining when said count counted by said first counter means is within predetermined count limits;
   second count comparator means for determining when said count counted by said second counter means is within said predetermined count limits; and
   error determining means for generating an error signal when one of said predetermined count limits is exceeded.

2. The detector recited in claim 1 further including:
   width detector means for measuring the width of said first output pulses or second second output pulses; and
   width comparator means for determining when said width is within predetermined width limits.

3. The apparatus recited in claim 2 wherein:
   said error determining means generates said error signal when either of said first or second count comparator means indicates said predetermined count limits are exceeded or said width comparator means indicates said predetermined width limits are exceeded.

4. The apparatus recited in claim 3 further including:
   third counter menas for counting the number of error signals generated during a measurement interval;
   third count comparator means for determining when said count counted by said third counter means exceeds a predetermined error count limit; and
   sync presence means for generating a sync presence signal if said predetermined error count limit is not exceeded.

5. The detector recited in claim 4 wherein: said width detector means includes a fourth counter means for counting the periods of a reference frequency signal during the duration of said first output pulses or said second output pulses; and
   said width comparator means includes a fourth count comparator means for determining when said count counted by said fourth counter means is within second predetermined count limits.

* * * * *